US006914458B2

(12) United States Patent
Joet et al.

(10) Patent No.: US 6,914,458 B2
(45) Date of Patent: Jul. 5, 2005

(54) METHOD AND DEVICE FOR GENERATING A SIGNAL WITH A FREQUENCY EQUAL TO THE PRODUCT OF A REFERENCE FREQUENCY AND A REAL NUMBER

(75) Inventors: Loïc Joet, Claix (FR); Sébastien Dedieu, Crolles (FR); Eric Andre, Fontaine (FR); Daniel Saias, Paris (FR)

(73) Assignee: STMicroelectronics SA, Montrouge (FR)

( * ) Notice: Subject to any disclaimer, the term of this patent is extended or adjusted under 35 U.S.C. 154(b) by 17 days.

(21) Appl. No.: 10/688,208

(22) Filed: Oct. 17, 2003

(65) Prior Publication Data

US 2004/0113665 A1 Jun. 17, 2004

(30) Foreign Application Priority Data

Oct. 17, 2002 (FR) ............................................ 02 12937

(51) Int. Cl.[7] .............................................. H03B 19/00
(52) U.S. Cl. ......................... 327/116; 327/156; 331/11
(58) Field of Search ........................ 327/113–117, 119, 327/156–162; 331/14, 10–12, 16, 17, 29.2; 375/373–376

(56) References Cited

U.S. PATENT DOCUMENTS

| | | | | | |
|---|---|---|---|---|---|
| 5,113,152 | A | * | 5/1992 | Norimatsu | .................... 331/11 |
| 5,216,387 | A | * | 6/1993 | Telewski et al. | .............. 331/11 |
| 5,365,202 | A | * | 11/1994 | Mori | ............................ 331/12 |
| 5,521,948 | A | * | 5/1996 | Takeuchi | ..................... 375/376 |
| 5,821,816 | A | | 10/1998 | Patterson | ..................... 331/1 A |
| 6,308,049 | B1 | * | 10/2001 | Bellaouar et al. | .............. 455/76 |
| 6,509,800 | B2 | * | 1/2003 | Stockton | ....................... 331/11 |
| 6,661,291 | B2 | * | 12/2003 | Jovenin | ....................... 331/1 A |
| 6,710,951 | B1 | * | 3/2004 | Cloke | ........................... 360/29 |

OTHER PUBLICATIONS

Djemouai et al., New Frequency–Locked Loop Based on CMOS Frequency–to–Voltage Converter: Design and Implementation, IEEE Transactions on Circuits and Systems–II: Analog and Digital Signal Processing, vol. 48, No. 5, May 2001, pp. 441–449, XP002247796.

* cited by examiner

*Primary Examiner*—Minh Nguyen
(74) *Attorney, Agent, or Firm*—Lisa K. Jorgenson; Allen, Dyer, Doppelt, Milbrath & Gilchrist, P.A.

(57) ABSTRACT

A method for generating a signal with a frequency equal to a product of a reference frequency and a real number includes providing an output signal from an oscillator, and performing a first integer division of a frequency of the output signal by a first integer divider to obtain a first intermediate signal. A first measurement signal representative of a time difference between the first intermediate signal and a reference signal having the reference frequency is determined. The method further includes generating a first comparison signal derived from the first measurement signal, and generating a second comparison signal dependent on a period of the reference signal, on integer and decimal parts of the real number and on the first integer divider. The first and second comparison signals are compared to obtain an error signal representative of a time difference between a period of a current output signal and the period of the reference signal. The first integer division is deactivated to deliver an error signal to the input of the oscillator, with the output signal from the oscillator forming the desired signal with a frequency equal to the product of the reference frequency and the real number.

29 Claims, 2 Drawing Sheets

METHOD AND DEVICE FOR GENERATING A SIGNAL WITH A FREQUENCY EQUAL TO THE PRODUCT OF A REFERENCE FREQUENCY AND A REAL NUMBER

FIELD OF THE INVENTION

The invention relates to frequency synthesis and is advantageous, but not limited, to wireless communication, and in particular, to mobile telephones that incorporate frequency synthesis within their transmission/reception system.

BACKGROUND OF THE INVENTION

A phase locked loop (PLL) is widely used for frequency synthesis. This type of looped system can multiply a reference frequency by an integer number and thus address an entire frequency range at a certain frequency step. More precisely, a phase locked loop is a servo-control system generating a frequency N times greater than the reference frequency that it receives in input, where N is an integer number. Thus, the output frequency given by a voltage-controlled oscillator is divided by N, and is then compared with a reference that may be supplied by a quartz. A charge pump formed from two current sources then reacts by injecting current into or drawing current out of the integrator filter that controls the output oscillator.

If the oscillator output frequency is an increasing function of its input voltage, the loop reaction is based on the following principle. The front comparator detects the first of the two fronts or leading edges. If this detected front belongs to the reference signal, the charge pump receives the command to send the current into the integrator filter. In this case, the output signal divided by N is delayed from the reference signal, and therefore the voltage at the oscillator terminals has to be increased.

Conversely, if the first detected front is the front of the output signal divided by N, the charge pump absorbs the current so that the voltage at the oscillator terminals drop. When the second front appears, the charge pump stops its activity while waiting for the next front. Thus, as the fronts become closer, the injected charge will be lower until the frequency of the oscillator output signal converges towards N times the reference frequency.

The phase locked loops can be used to synthesize frequencies with high precision and good stability. Their limitation is due to the fact that it is only possible to synthesize multiple integers, which limits the number of frequencies that can be addressed from a single reference frequency.

In order to overcome the problem of non-integer division, a "fractional" phase locked loop can be used that performs a succession of divisions by N and N+1. Thus, to make a division by N+0.5, we will divide once by N, then by N+1, and so on. The loop integrator filter then averages the value of the voltage controlling the loop output oscillator.

This type of architecture is one approach for dividing with a decimal part, but it introduces severe noise problems. Unlike the conventional phase locked loops mentioned above in which current injections are reduced until they become negligible under steady state conditions, fractional phase locked loops require large current injections at all times during their operation, since the frequency is between N and N+1 times the reference frequency, and it can only be compared at integer divisions.

These repeated current injections create noise that must be distributed. The size of the binary sequence controlling the divider by N or N+1 will impose this distribution. When the sequence is minimum, the oscillator voltage is modulated at the communication frequency of the dividers by N and N+1. The loop output spectrum then comprises two parasitic spikes. These spikes may cause major problems if they do respect noise specifications around the fundamental.

Furthermore, when the sequence becomes larger, parasite spikes due to the period of the sequence tend to spread. However, the loop integrator filter then has the time to react, which results in a variation of the fundamental with time. Thus, for very long sequences, parasitic spikes can be treated like noise distributed around the generated frequency, as a result of unwanted modulation of the output frequency.

In conclusion, the stability of the output frequency and the noise minimum very much limit the use of fractional phase locked loops.

SUMMARY OF THE INVENTION

One purpose of the invention is to propose a frequency synthesis that keeps all the advantages of conventional phase locked loops while eliminating noise inherent to fractional phase locked loops. Therefore, the invention proposes a method for generating a required signal with a required frequency equal to the product of a reference frequency and a real number.

According to one general characteristic of the invention, the method cyclically comprises a sequence of measurement phases and correction phases. The measurement phase may comprise a first integer division of the frequency of an oscillator output signal by a first integer divider so as to obtain a first intermediate signal. A first measurement signal representative of the time difference between this first intermediate signal and a reference signal according to the reference frequency is then determined.

A first comparison signal derived from the first measurement signal is then compared with a second comparison signal that depends on the reference period, the integer part and the decimal part of the real number, and the first integer divider so as to obtain an error signal representative of the time difference between the period of the current output signal from the oscillator and the required period.

The correction phase may comprise a deactivation of the first frequency divider and a correction of the oscillator control starting from the error signal. The oscillator output signal forms the required signal.

In other words, in general, the measurement phase takes place at least using a time deviation measurement loop with an integer division. This loop is open on the input side of the voltage controlled oscillator. Thus, during a measurement period which may for example be a period of the reference signal, the first comparison signal which may for example be equal to the product of the first measurement signal and a weighting factor, is compared with a second comparison signal which, when a single loop is used, is similar to a set signal. The set signal represents the time difference between the reference signal and a signal for which the period is equal to N1 times the required period of the required output signal, where N1 is the first integer divider.

The invention thus provides precise information about the difference between the output frequency and the required frequency, and the loop reacts to the real deviation such that the loop becomes stable and there are no parasitic spikes inherent to conventional fractional phase locked loops.

When the measurement phase is made during one reference signal period, the correction phase can then take place during the next period of the reference signal, and so on. The measurement phase may more generally take place during an integer number of periods of the reference signal while the correction phase may take place during another integer number of subsequent periods of the reference signal, identical to or different from the first integer number.

According to one preferred embodiment of the invention, the second comparison signal may be generated within a second time difference measurement loop with integer division. More precisely, according to this embodiment, generation of the second comparison signal may comprise a second integer division of the oscillator output signal frequency by a second integer divider so as to obtain a second intermediate signal. Determination of a second measurement signal representative of the time difference between this second intermediate signal and the reference signal is made. The second intermediate signal is weighted by a second weighting factor obtained from the first integer divider, the integer part and the decimal part of the real number.

Furthermore, generation of the first comparison signal includes weighting of the first measurement signal by a first weighting factor obtained from the second integer divider, the integer part and the decimal part of the real number.

The correction phase then also comprises deactivation of the second frequency divider. Thus, for example, if the first integer divider is equal to N1 and the second integer divider is equal to N2, the first weighting factor may be equal to −(N2−N−f) while the second weighting factor will be equal to N1−N−f. The variables N and f denote the integer part and the decimal part respectively of the real number which when multiplied by the reference frequency supplies the required frequency.

One particular straightforward way of implementing the invention includes for example using a first integer divider equal to N+1 and a second integer divider equal to N−1. The first weighting factor is then equal to 1+f while the second weighting factor is then equal to 1−f.

Another purpose of the invention is to provide a device for generation of a required signal with a required frequency equal to the product of a reference frequency and a real number.

According to one general characteristic of the invention, the device may comprise a controlled oscillator, and first division means capable of making a first integer division of the oscillator output signal frequency by a first integer divider so as to obtain a first intermediate signal. First determination means are capable of determining a first measurement signal representative of the time difference between this first intermediate signal and a reference signal with the reference frequency.

The device may further comprise generation means capable of generating a first comparison signal derived from the first measurement signal, and second generation means capable of generating a second comparison signal dependent on the reference period, the integer part and the decimal part of the real number and the first integer divider.

Comparison means are capable of making a comparison between the two comparison signals so as to obtain an error signal representative of the time difference between the period of the current output signal from the oscillator and the required period. A switch is connected between the output from the comparison means and the oscillator control input.

Control means open and close the switch successively and cyclically and deactivating the first divider when the switch is closed, so as to successively enable determination of the error signal and to deliver this error signal on the oscillator control input. The oscillator output signal forms the required signal. According to one embodiment of the invention, the control means open and then close the switch during successive periods of the reference signal.

According to one advantageous embodiment of the invention, the second generation means may comprise a second divider capable of making a second integer division of the oscillator output signal frequency, and second determination means capable of determining a second measurement signal representative of the time difference between this second intermediate signal and the reference signal. Second weighting means are capable of weighting the second intermediate signal by a second weighting factor obtained from the first integer divider, the integer part and the decimal part of the real number.

Furthermore, according to this embodiment, the first generation means may comprise first weighting means capable of weighting the first measurement signal by a weighting factor obtained from the second integer divider, the integer part and the decimal part of the real number. The control means may also be designed to deactivate the second divider when the switch is closed.

The device according to the invention is advantageously made in the form of an integrated circuit. The invention is also applicable to a terminal of a wireless communication system comprising a generation device as defined above. For example, this terminal could be a mobile cell phone.

BRIEF DESCRIPTION OF THE DRAWINGS

Other advantages and characteristics of the invention will become clear after reading the detailed description of one embodiment and usage method, which is in no way to be limiting, and the appended drawings, wherein.

DETAILED DESCRIPTION OF THE PREFERRED EMBODIMENTS

Figure 1:
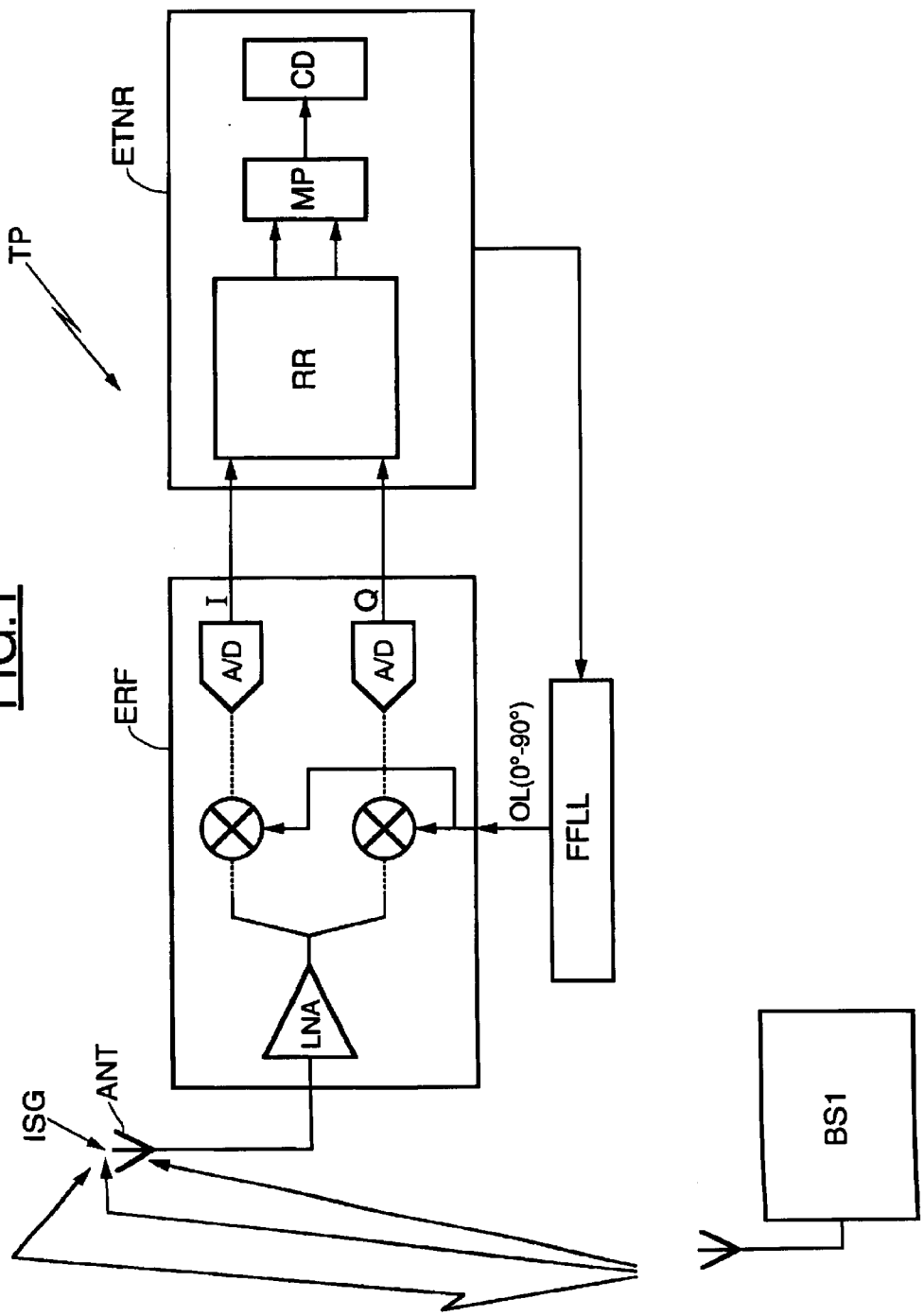
FIG. 1 diagrammatically illustrates a mobile cell phone incorporating a device according to the present invention.

In FIG. 1, the reference TP denotes a remote terminal, like a mobile cell phone, that is in communication with a base station BS1, for example using a CDMA-FDD type communication system. The mobile cell phone conventionally comprises an analog radio frequency stage ERF connected to an antenna ANT to receive an input signal ISG.

Conventionally, the ERF stage comprises a low noise amplifier LNA and two processing channels comprising mixers, filters and conventional amplifiers (not shown in FIG. 1). Both of the two mixers receive two signals OL from a device FFLL, with a phase difference between them of 90°. After frequency transposition in the mixers, the two processing channels define two flows, I (direct flow) and Q (flow in quadrature), to use terminology well known to those skilled in the art.

After digital conversion in the analog/digital converters, the two I and Q flows are output to a reception processing stage ETNR. This processing stage ETNR comprises a receiver RR, commonly referred to as a Rake receiver, followed by conventional demodulation means MP that demodulate the frequency spectrum output by the Rake receiver RR. The demodulation means MP are followed by a conventional channel decoder CD.

Figure 2:
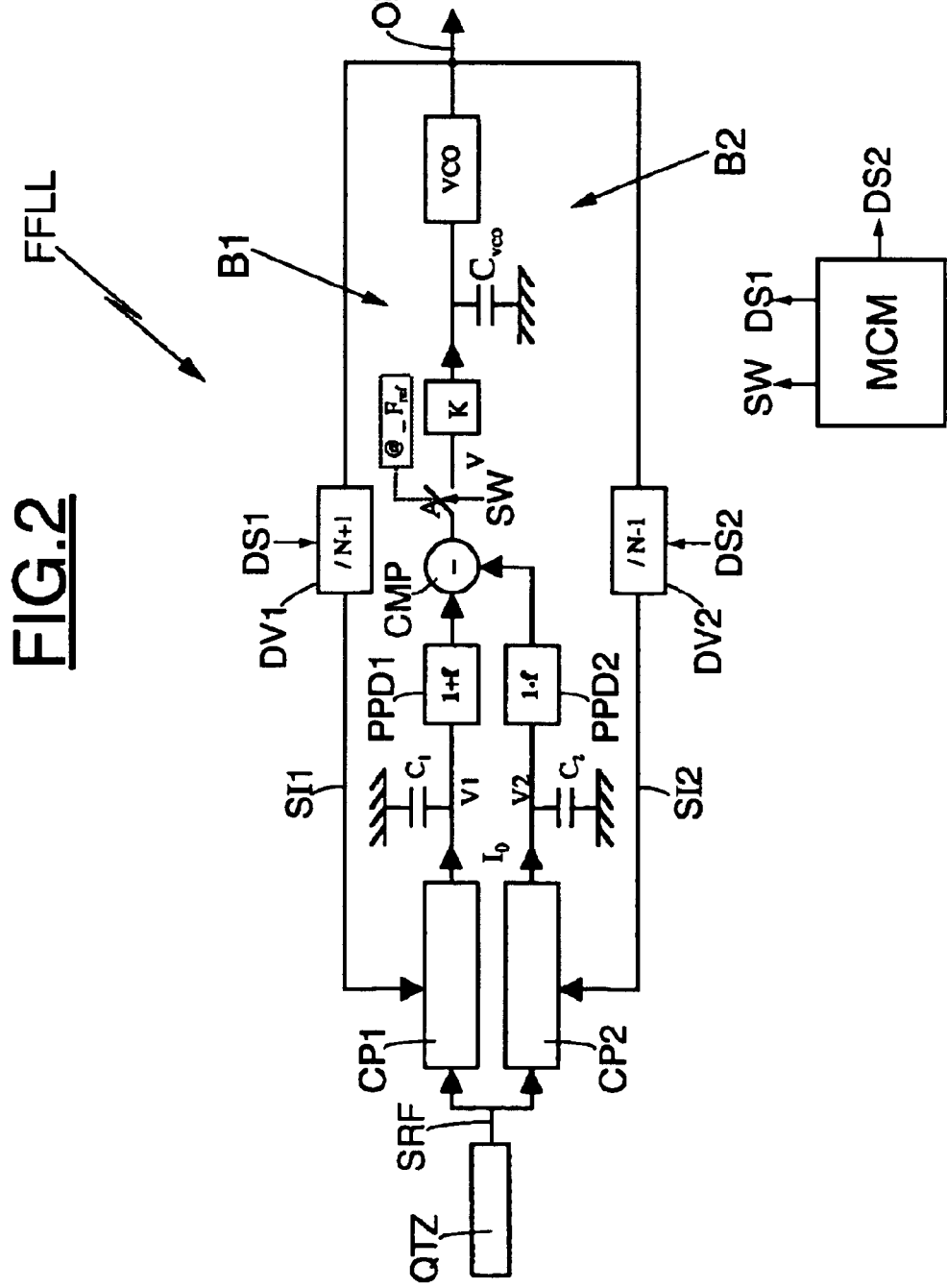
FIG. 2 diagrammatically illustrates in more detail one embodiment of the device according to the present invention.

We will now refer more particularly to FIG. 2 to illustrate one embodiment of a frequency tuner device FFLL according to the invention. This device comprises a voltage-controlled oscillator VCO, for which the output delivers the required output signal, in fact the local oscillator signal OL (FIG. 1). Obviously, the phase shift between the two local oscillator signals OL illustrated in FIG. 1 can easily be obtained by placing a phase shifter at the output from the oscillator VCO. Although a voltage controlled oscillator is shown in this case, any type of controlled oscillator will be suitable, for example a current controlled oscillator.

In this case, the device FFLL comprises two loops B1 and B2. The first loop B1 comprises a first divider DV1 capable of making an integer division, in fact by N, of the output signal delivered by the oscillator VCO. This first intermediate signal SI1 delivered by the divider DV1 is supplied to the first determination means CP1, in this case comprising a front detector followed by a charge pump. These first determination means CP1 also receive a reference signal SRF with a reference period $T_{ref}$. This reference signal SRF is output by a quartz QTZ.

A first capacitor C1 is also connected between ground and the output from the first determination means CP1. Moreover, the first weighting means PPD1 are connected between the other terminal of the capacitance of capacitor C1 and the first input of a subtractor CMP (comparison means).

The output from the subtractor is connected to the filter of loop K through a switch A controlled at the reference frequency $F_{ref}$ by a control signal SW output by the control means MCM. The output from the loop filter K is connected to the oscillator VCO and to a capacitor $C_{vcq}$ to control the control voltage of the oscillator.

The second loop B2 of the device FFLL comprises a second divider DV2 that can also make an integer division of the output signal from the oscillator VCO. This second divider actually divides by N−1 and outputs a second intermediate signal SI2 to the second determination means CP2 with a structure similar to the first determination means CP1.

These second determination means also receive the reference signal SRF. A second capacitor C2 is connected to the output from means CP2 and to the second weighting means PPD2. The output from these second weighting means PPD2 is connected to the other input of the subtractor CMP.

Furthermore, the two dividers DV1 and DV2 may be activated or deactivated respectively by two logical signals DS1, DS2 also output by the control means MCM. The device according to the invention can thus directly make a division by a real number with a decimal part with several bits, actually by a number equal to N+f where N denotes the integer part of the real divider and f denotes the decimal part. Therefore the invention differs from the prior art, and particularly from fractional phase locked systems that require the alternate use of two integer divisions.

According to the embodiment shown in FIG. 2, the integer divisions by N+1 and by N−1 are made simultaneously, so that the difference between the output frequency and the required frequency is known exactly. Thus, the loops react to the real difference and not to the difference between the output frequency and an integer number times the reference. The difference reduces until it becomes negligible. The loop remains stable and parasitic spikes inherent to conventional fractional phase locked loops disappear.

More precisely, the method according to the invention is spread over two phases, namely a measurement phase and a correction phase. The measurement phase is made on one measurement period, for example a reference signal period $S_{ref}$.

This measurement period is used to measure the output frequency $F_{out}$. During this time, the set of two loops B1 and B2 is open at switch A, immediately before capacitor $C_{vco}$ maintaining the oscillator control voltage, to prevent the loop reaction from disturbing the measurement. Loop B2 measures the time difference between the second intermediate signal SI2 with a period equal to $(N-1)T_{out}$ and the reference signal with period $T_{ref}$.

At the end of the measurement, the voltage at the terminals of capacitor C2 is equal to $$V_2 = \frac{I_0}{C_2}[T_{ref} - (N-1)T_{out}] \quad (I)$$

Loop B1 supplies the difference between the first intermediate signal SI1 with a period equal to $(N+1)T_{out}$ and the reference signal.

At the end of the measurement, the voltage at the terminals of the capacitor C1 is equal to:

$$V_1 = \frac{I_0}{C_2}[(N+1)T_{out} - T_{ref}] \quad (II)$$

The correction phase is then carried out during the next period after the reference signal. The frequency dividers DV1 and DV2 are deactivated and reset to 0 and switch A is closed. The voltages of the two capacitors weighted by factors equal to (1+f) and (1−f) are then subtracted. The voltage V obtained gives the difference between the output frequency and the required frequency.

This voltage is supplied by formula (III) below $$V = (1+f)\frac{I_0}{C_1}[(N+1)T_{out} - T_{ref}] - (1-f)\frac{I_0}{C_2}[T_{ref} - (N-1)T_{out}] \quad (III)$$

If $C1=C2=C_0$, the voltage V is given by the following formula which then reduces to formula (IV)

$$V = \frac{I_0}{C_0}[(N+1)T_{out} - T_{ref} + (N-1)T_{out} - \quad (IV)$$
$$T_{ref} + f[(N+1)T_{out} - T_{ref} + T_{ref} - (N-1)T_{out}]]$$
$$V = \frac{2.I_0}{C_0}[(N+f)T_{out} - T_{ref}]$$

Therefore, the difference between the required period and the actual period is available.

This voltage is then transformed to a current so that it can be integrated in the capacitor $C_{vco}$. The capacitances of the charge pumps have to be drained before starting the measurement again. In other words, during an integer number of subsequent periods of the reference signal (for example, during the next period). The counters will be activated at the next front of the reference signal.

Thus, the system according to the invention is capable of multiplying the frequency by a real number with a decimal part, and maintains all the advantages of conventional phase locked loops while eliminating noise inherent to fractional phase locked loops.

That which is claimed is:

1. A method for generating a signal with a frequency equal to a product of a reference frequency and a real number, the method comprising:

performing a sequence of measurement phases and correction phases;

the measurement phase comprising
  providing an output signal from an oscillator,
  performing a first integer division of a frequency of the output signal by a first integer divider to obtain a first intermediate signal,
  determining a first measurement signal representative of a time difference between the first intermediate signal and a reference signal having the reference frequency,
  generating a first comparison signal derived from the first measurement signal,
  generating a second comparison signal dependent on a period of the reference signal, on integer and decimal parts of the real number and on the first integer divider,
  comparing the first and second comparison signals to obtain an error signal representative of a time difference between a period of the output signal and the period of the reference signal, and the correction phase comprising deactivating the first integer division to determine and deliver the error signal to the oscillator, with the output signal from the oscillator forming the desired signal with a frequency equal to the product of the reference frequency and the real number.

2. A method according to claim 1, wherein the measurement phase takes place during an integer number of periods of the reference signal, and the correction phase takes place during another integer number of periods of the reference signal.

3. A method according to claim 1, wherein generating the second comparison signal comprises:
  performing a second integer division of the frequency of the output signal by a second integer divider to obtain a second intermediate signal;
  determining a second measurement signal representative of a time difference between the second intermediate signal and the reference signal; and
  weighting the second intermediate signal by a second weighting factor obtained from the first integer divider and the integer and decimal parts of the real number.

4. A method according to claim 3, wherein generating the first comparison signal comprising weighting the first measurement signal by a first weighting factor obtained from the second integer divider, and from the integer and decimal parts of the real number; and wherein the correction phase further comprises deactivating the second integer division.

5. A method according to claim 4, wherein the first integer divider is equal to N+1, with N being the integer part of the real number; wherein the second integer divider is equal to N−1; wherein the first weighting factor is equal to 1+f, where f is the decimal part of the real number; and wherein the second weighting factor is equal to 1−f.

6. A method for generating a signal comprising:
  providing an output signal from an oscillator;
  performing a first integer division of a frequency of the output signal by a first integer divider to obtain a first intermediate signal;
  determining a first measurement signal representative of a time difference between the first intermediate signal and a reference signal having a reference frequency;
  generating a first comparison signal derived from the first measurement signal;
  generating a second comparison signal dependent on a period of the reference signal, on integer and decimal parts of a real number and on the first integer divider;
  comparing the first and second comparison signals to obtain an error signal representative of a time difference between a period of the output signal and the period of the reference signal; and
  deactivating the first integer division to determine and deliver the error signal to the oscillator, with the output signal from the oscillator forming the desired signal with a frequency equal to the product of the reference frequency and the real number.

7. A method according to claim 6, wherein the providing, the performing, the determining, the generating and the comparing are performed during an integer number of periods of the reference signal, and wherein the deactivating is performed during another integer number of periods of the reference signal.

8. A method according to claim 6, wherein generating the second comparison signal comprises:
  performing a second integer division of the frequency of the output signal by a second integer divider to obtain a second intermediate signal;
  determining a second measurement signal representative of a time difference between the second intermediate signal and the reference signal; and
  weighting the second intermediate signal by a second weighting factor obtained from the first integer divider and the integer and decimal parts of the real number.

9. A method according to claim 8, wherein generating the first comparison signal comprising weighting the first measurement signal by a first weighting factor obtained from the second integer divider, and from the integer and decimal parts of the real number; and further comprising deactivating the second integer division.

10. A method according to claim 9, wherein the first integer divider is equal to N+1, with N being the integer part of the real number; wherein the second integer divider is equal to N−1; wherein the first weighting factor is equal to 1+f, where f is the decimal part of the real number; and wherein the second weighting factor is equal to 1−f.

11. A device for generating a signal with a frequency equal to a product of a reference frequency and a real number, the device comprising:
  a controlled oscillator for providing an output signal;
  first division means for performing a first integer division of a frequency of the output signal by a first integer divider to obtain a first intermediate signal;
  first determination means for determining a first measurement signal representative of a time difference between the first intermediate signal and a reference signal having the reference frequency;
  first generation means for generating a first comparison signal derived from the first measurement signal;
  second generation means for generating a second comparison signal dependent on a period of the reference signal, integer and decimal parts of the real number and the first integer divider;
  comparison means for comparing the first and second comparison signals to obtain an error signal representative of a time difference between a period of a current output signal and the period of the reference signal;
  a switch connected between an output of said comparison means and an input of said controlled oscillator; and
  control means for opening and closing said switch and deactivating said first division means when said switch is closed to determine the error signal and to deliver the error signal to the input of said controlled oscillator, with the output signal from said controlled oscillator forming the desired signal with a frequency equal to the product of the reference frequency and the real number.

12. A device according to claim 11, wherein said control means open and close said switch during successive periods of the reference signal.

13. A device according to claim 11, wherein said second generation means comprise:
   second division means for performing a second integer division of the frequency of the output signal by a second integer divider to obtain a second intermediate signal;
   second determination means for determining a second measurement signal representative of a time difference between the second intermediate signal and the reference signal; and
   second weighting means for weighting the second intermediate signal by a second weighting factor obtained from the first integer divider and from the integer and decimal parts of the real number.

14. A device according to claim 13, wherein said first generation means comprise first weighting means for weighting the first measurement signal by a first weighting factor obtained from the second integer divider, and from the integer and decimal parts of the real number; and wherein said control means also deactivates said second division means when said switch is closed.

15. A device according to claim 14, wherein the first integer divider is equal to N+1, where N is the integer part of the real number; wherein the second integer divider is equal to N−1; wherein the first weighting factor is equal to 1+f, where if is the decimal part of the real number; and wherein the second weighting factor is equal to 1−f.

16. A device according to claim 11, wherein said controlled oscillator, said first division means, said first determination means, said first and second generation means, said comparison means, said switch and said control means are formed as an integrated circuit.

17. A frequency tuning device comprising:
   a controlled oscillator for providing an output signal;
   a first division circuit for performing a first integer division of a frequency of the output signal by a first integer divider to obtain a first intermediate signal;
   a first determination circuit for determining a first measurement signal representative of a time difference between the first intermediate signal and a reference signal having the reference frequency;
   a first generation circuit for generating a first comparison signal derived from the first measurement signal;
   a second generation circuit for generating a second comparison signal dependent on a period of the reference signal, integer and decimal parts of a real number and the first integer divider;
   a comparison circuit for comparing the first and second comparison signals to obtain an error signal representative of a time difference between a period of a current output signal and the period of the reference signal;
   a switch connected between an output of said comparison circuit and an input of said controlled oscillator; and
   a control circuit for opening and closing said switch and deactivating said first division circuit when said switch is closed to determine the error signal and to deliver the error signal to the input of said controlled oscillator, with the output signal from said controlled oscillator forming the desired signal with a frequency equal to a product of the reference frequency and the real number.

18. A frequency tuning device according to claim 17, wherein said control circuit opens and closes said switch during successive periods of the reference signal.

19. A frequency tuning device according to claim 17, wherein said second generation circuit comprises:
   a second divider for performing a second integer division of the frequency of the output signal by a second integer divider to obtain a second intermediate signal;
   a second determination circuit for determining a second measurement signal representative of a time difference between the second intermediate signal and the reference signal; and
   a second weighting circuit for weighting the second intermediate signal by a second weighting factor obtained from the first integer divider and from the integer and decimal parts of the real number.

20. A frequency tuning device according to claim 19, wherein said first generation circuit comprises a first weighting circuit for weighting the first measurement signal by a first weighting factor obtained from the second integer divider, and from the integer and decimal parts of the real number; and wherein said control circuit also deactivates said second division circuit when said switch is closed.

21. A frequency tuning device according to claim 20, wherein the first integer divider is equal to N+1, where N is the integer part of the real number; wherein the second integer divider is equal to N−1; wherein the first weighting factor is equal to 1+f, where f is the decimal part of the real number; and wherein the second weighting factor is equal to 1−f.

22. A frequency tuning device according to claim 17, wherein said controlled oscillator, said first division circuit, said first determination circuit, said first and second generation circuits, said comparison circuit, said switch and said control circuit are formed as an integrated circuit.

23. A terminal of a wireless communication system comprising:
   an antenna;
   an analog stage connected to said antenna;
   a reception processing stage connected to said analog stage and providing a reference signal; and
   a frequency tuning device connected to said, analog stage and to said reception stage, said frequency tuning circuit comprising
      a controlled oscillator for providing an output signal to said analog stage,
      a first division circuit for performing a first integer division of a frequency of the output signal by a first integer divider to obtain a first intermediate signal,
      a first determination circuit for determining a first measurement signal representative of a time difference between the first intermediate signal and the reference signal having a reference frequency,
      a first generation circuit for generating a first comparison signal derived from the first measurement signal,
      a second generation circuit for generating a second comparison signal dependent on a period of the reference signal, on integer and decimal parts of a real number and on the first integer divider,
      a comparison circuit for comparing the first and second comparison signals to obtain an error signal representative of a time difference between a period of a current output signal and the period of the reference signal,
      a switch connected between an output of said comparison circuit and an input of said controlled oscillator, and a control circuit for opening and closing said switch and deactivating said first division circuit when said switch is closed to determine the error signal and to deliver the error signal to the input of said controlled oscillator, with the output signal from said oscillator forming the desired signal with a frequency equal to the product of the reference frequency and the real number.

24. A terminal according to claim 23, wherein said control circuit opens and closes said switch during successive periods of the reference signal.

25. A terminal according to claim 24, wherein said second generation circuit comprises:

a second divider for performing a second integer division of the frequency of the output signal by a second integer divider to obtain a second intermediate signal;

a second determination circuit for determining a second measurement signal representative of a time difference between the second intermediate signal and the reference signal; and a second weighting circuit for weighting the second intermediate signal by a second weighting factor obtained from the first integer divider and from the integer and decimal parts of the real number.

26. A terminal according to claim 25, wherein said first generation circuit comprises a first weighting circuit for weighting the first measurement signal by a first weighting factor obtained from the second integer divider, and from the integer and decimal parts of the real number; and wherein said control circuit also deactivates said second division circuit when said switch is closed.

27. A terminal according to claim 26, wherein the first integer divider is equal to N+1, where N is the integer part of the real number; wherein the second integer divider is equal to N−1; wherein the first weighting factor is equal to 1+f, where f is the decimal part of the real number; and wherein the second weighting factor is equal to 1−f.

28. A terminal according to claim 24, wherein said controlled oscillator, said first division circuit, said first determination circuit, said first and second generation circuits, said comparison circuit, said switch and said control circuit are formed as an integrated circuit.

29. A terminal according to claims 24, wherein the terminal is configured as a mobile cell phone.

* * * * *

UNITED STATES PATENT AND TRADEMARK OFFICE
CERTIFICATE OF CORRECTION

PATENT NO. : 6,914,458 B2
DATED : July 5, 2005
INVENTOR(S) : Joet et al.

It is certified that error appears in the above-identified patent and that said Letters Patent is hereby corrected as shown below:

Column 2,
Line 5, insert -- not -- after "do".

Column 9,
Line 32, delete "if" insert -- f --.

Column 10,
Line 42, delete "," after "said".

Signed and Sealed this

Eighth Day of November, 2005

JON W. DUDAS
*Director of the United States Patent and Trademark Office*